United States Patent
Fujita et al.

(10) Patent No.: US 7,987,062 B2
(45) Date of Patent: Jul. 26, 2011

(54) DELAY CIRCUIT, TEST APPARATUS, STORAGE MEDIUM SEMICONDUCTOR CHIP, INITIALIZING CIRCUIT AND INITIALIZING METHOD

(75) Inventors: Kazuhiro Fujita, Tokyo (JP); Masakatsu Suda, Tokyo (JP); Takuya Hasumi, Tokyo (JP)

(73) Assignee: Advantest Corporation, Tokyo (JP)

( * ) Notice: Subject to any disclaimer, the term of this patent is extended or adjusted under 35 U.S.C. 154(b) by 757 days.

(21) Appl. No.: 11/763,448

(22) Filed: Jun. 15, 2007

(65) Prior Publication Data
US 2008/0048750 A1  Feb. 28, 2008

(30) Foreign Application Priority Data
Aug. 23, 2006 (JP) .................................. 2006-226478

(51) Int. Cl.
*G01R 29/02* (2006.01)
(52) U.S. Cl. ................ 702/79; 702/89; 702/90; 702/91; 327/161; 327/261
(58) Field of Classification Search .......................... None
See application file for complete search history.

(56) References Cited

U.S. PATENT DOCUMENTS

| | | | | |
|---|---|---|---|---|
| 4,859,970 A | * | 8/1989 | Matsuo et al. | 331/57 |
| 5,491,673 A | * | 2/1996 | Okayasu | 368/120 |
| 6,812,799 B2 | * | 11/2004 | Kirsch | 331/57 |
| 2004/0054482 A1 | * | 3/2004 | Poechmueller | 702/57 |
| 2005/0001648 A1 | * | 1/2005 | Yamamoto | 324/772 |

FOREIGN PATENT DOCUMENTS

| | | |
|---|---|---|
| JP | 2001-215261 | 8/2001 |
| JP | 2002-359289 | 12/2002 |

* cited by examiner

*Primary Examiner* — Drew A Dunn
*Assistant Examiner* — Mi'schita' Henson
(74) *Attorney, Agent, or Firm* — Osha Liang LLP

(57) ABSTRACT

A delay circuit includes a first delay element, a second delay element, and an initializing section that measures a delay amount generated by the first delay element with respect to each delay setting value. The initializing section includes a first loop path that inputs an output signal of the first delay element into the first delay element and a second loop path that inputs an output signal of the second delay element into the second delay element. The initialization section includes a first measuring section that sequentially sets delay setting values mutually different from the delay setting value in the first delay element and sequentially measures delay amounts in the first delay element, a second measuring section that measures a delay amount in the second delay element, and a delay amount computing section that corrects a delay amount measured by the first measuring section.

13 Claims, 5 Drawing Sheets

DELAY CIRCUIT, TEST APPARATUS, STORAGE MEDIUM SEMICONDUCTOR CHIP, INITIALIZING CIRCUIT AND INITIALIZING METHOD

CROSS REFERENCE TO RELATED APPLICATION

The present application claims priority from a Japanese Patent Application No. 2006-226478 filed on Aug. 23, 2006, the contents of which are incorporated herein by reference.

BACKGROUND

1. Technical Field

The present invention relates to a delay circuit, a test apparatus, a storage medium, and a semiconductor chip. More particularly, the present invention relates to a delay circuit that can measure a delay amount of a delay element with high precision.

2. Related Art

Conventionally, there has been performed an initialization based on a delay amount generated by a delay element for delaying a signal with respect to a delay setting value set in the delay element. According to a conventional initialization, a loop path is formed on which a signal output from a delay element is again input into this delay element. A period for which the signal is transmitted through the loop path is measured, in order to measure a delay amount of the delay element.

For example, on the basis of a difference between a first loop period when a delay amount of a delay element is set to substantially zero and a second loop period when a predetermined delay setting value is set in the delay element, a delay amount with respect to this delay setting value is measured as disclosed, for example, in Japanese Patent Application Publication 2001-215261 and Japanese Patent Application Publication 2002-359289.

However, since the first loop period and the second loop period cannot be measured at the same time, a power supply voltage supplied to the delay element when measuring the first loop period may be different than a power supply voltage supplied to the delay element when measuring the second loop period. For example, a power supply voltage may vary due to a power source noise.

Since a delay amount of the loop path and the delay element varies when a power supply voltage varies, a measured delay amount has an error. For example, when a variation coefficient of a delay amount of the loop path and the delay element to the variation of the power supply voltage is 0.1%/mV, a result obtained by measuring the delay amount has an error of 0.1% if the power supply voltage has the variation of 1 mV.

Moreover, a delay amount on the loop path is much larger than a delay amount of the delay element. According to a conventional measuring method, since a difference between loop periods is generated by means of changing a delay setting value, a delay amount of the delay element has been measured from this difference. For this reason, the variation of the delay amount on the loop path caused by the variation of the power supply voltage results in a large error in a measurement result for the delay amount of the delay element.

SUMMARY

Therefore, it is an object of some aspects of the present invention to provide a delay circuit, a test apparatus, a computer-readable medium, and a semiconductor chip that can solve the foregoing problems. The above and other objects can be achieved by combinations of features described in the independent claims. The dependent claims define further advantageous and exemplary combinations of the present invention.

That is, according to the first aspect of the present invention, there is provided a delay circuit that delays an input signal to output a delayed signal. The delay circuit includes a first delay element that delays the input signal in a delay amount according to a set delay value, a second delay element that delays the input signal in a delay amount according to a set delay value. An initializing section measures a delay amount generated by the first delay element with respect to each of the delay setting values and initializes the first delay element. The initializing section includes a first loop path that inputs an output signal of the first delay element into the first delay element and a second loop path that inputs an output signal of the second delay element into the second delay element. The initialization section also includes a first measuring section that sequentially sets delay setting values mutually different from the delay setting value in the first delay element and sequentially measures delay amounts in the first delay element on the basis of signals transmitted through the first loop path. The initialization section has a second measuring section that measures a delay amount in the second delay element in synchronization with the first measuring section on the basis of a signal transmitted through the second loop path without changing the delay setting value of the second delay element. A delay amount computing section corrects each of the delay amounts measured by the first measuring section by means of the delay amount measured by the second measuring section in synchronization with this delay amount and further computes a delay amount for each of the delay setting values of the first delay element.

The second delay element may receive a power supply voltage from a power supply common to the first delay element. The delay amount computing section may correct a measurement error in a measurement result measured by the first measuring section, which is caused by a variation of a power supply voltage of the first delay element, by means of a measurement result measured by the second measuring section. The delay amount computing section may generate a first computation result obtained by subtracting a second delay amount measured by the first measuring section with respect to a first delay setting value from a first delay amount measured by the first measuring section with respect to the first delay setting value. The computing section may also generate a second computation result obtained by subtracting a delay amount measured by the second measuring section in synchronization with a measurement of the second delay amount from a delay amount measured by the second measuring section in synchronization with a measurement of the first delay amount. The computing section then subtracts the second computation result from the first computation result, in order to compute a variation amount of the delay amount of the first delay element when changing the delay setting value from the second delay setting value to the first delay setting value.

The first measuring section may set the delay setting value causing the first delay element to generate a minimum delay amount in the first delay element as the first delay setting value. The second measuring section may set the delay setting value causing the second delay element to generate a minimum delay amount in the second delay element. A ratio of a variation amount of the delay amount of the second delay element to a variation amount of the power supply voltage may be substantially equal to a ratio of a variation amount of the delay amount of the first delay element to the variation amount of the power supply voltage.

A first transmission circuit provided on the first loop path and a second transmission circuit provided on the second loop path may receive a power supply voltage from the power supply common to the first delay element. A ratio of a variation amount of a delay amount of the second transmission circuit to a variation amount of the power supply voltage may be substantially equal to a ratio of a variation amount of a delay amount of the first transmission circuit to the variation amount of the power supply voltage.

A difference between a delay amount of the first delay element and the first loop path, when causing the first delay element to produce the minimum delay amount, and a delay amount of the second delay element and the second loop path, when causing the second delay element to produce the minimum delay amount, may be substantially equal to the delay amount of the first delay element corresponding to the second delay setting value.

The second measuring section may set the delay amount of the second delay element such that a loop period on the second loop path compared to a loop period on the first loop path has a period difference determined on condition that the signal transmitted through the first loop path and the signal transmitted through the second loop path do not interfere with each other.

The second measuring section may sequentially set different delay setting values in the second delay element and further respectively measure delay amounts in the second delay element on the basis of signals transmitted through the second loop path. The first measuring section may further measure the delay amounts in the first delay element in synchronization with the second measuring section on the basis of the signals transmitted through the first loop path without changing the delay setting value. The delay amount computing section may correct each delay amount measured by the second measuring section by means of a delay amount measured in synchronization with this delay amount by the first measuring section. The delay amount computing section further computes delay amounts for the respective delay setting values of the second delay element.

According to the second aspect of the present invention, there is provided a test apparatus that tests a device under test. The test apparatus includes a pattern generating section that generates a test pattern for testing the device under test, a plurality of waveform shaping sections that generates test signals showing a level shown in the test pattern in accordance with given timing signals, and a timing generating section that generates the timing signals. The apparatus further includes a delay circuit that respectively delays the timing signals and supplies delayed signals to each of the waveform shaping sections and a deciding section that decides a quality of the device under test on the basis of an output signal output from the device under test. The delay circuit includes a first delay element that delays the timing signal in a delay amount according to a delay setting value that is set and supplies a delayed signal to a first of the waveform shaping sections, a second delay element that delays the timing signal in a delay amount according to a delay setting value that is set and supplies the delayed signal to a second of the waveform shaping sections, and an initializing section that measures delay amounts generated by the first delay element and the second delay element with respect to each of the delay setting values. The delay circuit then initializes the first delay element and the second delay element. The initializing section includes a first loop path that inputs an output signal of the first delay element into the first delay element and a second loop path that inputs an output signal of the second delay element into the second delay element. The initialization section includes a first measuring section that sequentially sets delay setting values mutually different from the delay setting value in the first delay element and sequentially measures delay amounts in the first delay element on the basis of signals transmitted through the first loop path. The initialization section also includes a second measuring section that measures a delay amount in the second delay element in synchronization with the first measuring section on the basis of a signal transmitted through the second loop path. A delay amount computing section corrects each of the delay amounts measured by the first measuring section by means of the delay amount measured by the second measuring section in synchronization with this delay amount and further computes a delay amount for each of the delay setting values of the first delay element.

According to the third aspect of the present invention, there is provided a computer-readable medium that stores thereon a program causing an initializing section, which initializes a delay circuit including a first delay element that delays an input signal in a delay amount according to a set delay value. The medium also causes a second delay element that delays the input signal in a delay amount according to a set delay value. The medium also causes a first loop path that inputs an output signal of the first delay element into the first delay element and a second loop path that inputs an output signal from the second delay element into the second delay element. The computer-readable medium functions as a first measuring section that sequentially sets delay setting values mutually different from the delay setting value in the first delay element and sequentially measures delay amounts in the first delay element on the basis of signals transmitted through the first loop path. The computer-readable medium also functions as a second measuring section that measures a delay amount in the second delay element in synchronization with the first measuring section on the basis of a signal transmitted through the second loop path without changing the delay setting value of the second delay element. A delay amount computing section corrects each of the delay amounts measured by the first measuring section by means of the delay amount measured by the second measuring section in synchronization with this delay amount and further computes a delay amount for each of the delay setting values of the first delay element.

According to the fourth aspect of the present invention, there is provided a semiconductor chip. The semiconductor chip includes an operation circuit and a delay circuit that delays a signal input into the operation circuit or a signal output from the operation circuit. The delay circuit includes a first delay element that delays an input signal in a delay amount according to a set delay value and a second delay element that delays the input signal in a delay amount according to a set delay value. The delay circuit includes an initializing section that measures a delay amount generated by the first delay element with respect to each of the delay setting values and initializes the first delay element. The initializing section includes a first loop path that inputs an output signal of the first delay element into the first delay element and a second loop path that inputs an output signal of the second delay element into the second delay element. The initialization section includes a first measuring section that sequentially sets delay setting values mutually different from the delay setting value in the first delay element and sequentially measures delay amounts in the first delay element on the basis of signals transmitted through the first loop path. The initialization section also includes a second measuring section that measures a delay amount in the second delay element in synchronization with the first measuring section on the basis of a signal transmitted through the second loop path without changing the delay setting value of the second delay element. A delay amount computing section corrects each of the delay amounts measured by the first measuring section by means of the delay amount measured by the second measuring section in synchronization with this delay amount and further computes a delay amount for each of the delay setting values of the first delay element.

The summary does not necessarily describe all necessary features of the present invention. The present invention may also be a sub-combination of the features described above.

DETAILED DESCRIPTION

Embodiments of the invention will now be described with reference to the drawings. All of the features and the combinations thereof described in the embodiments are not necessarily essential to the invention.

Figure 1:
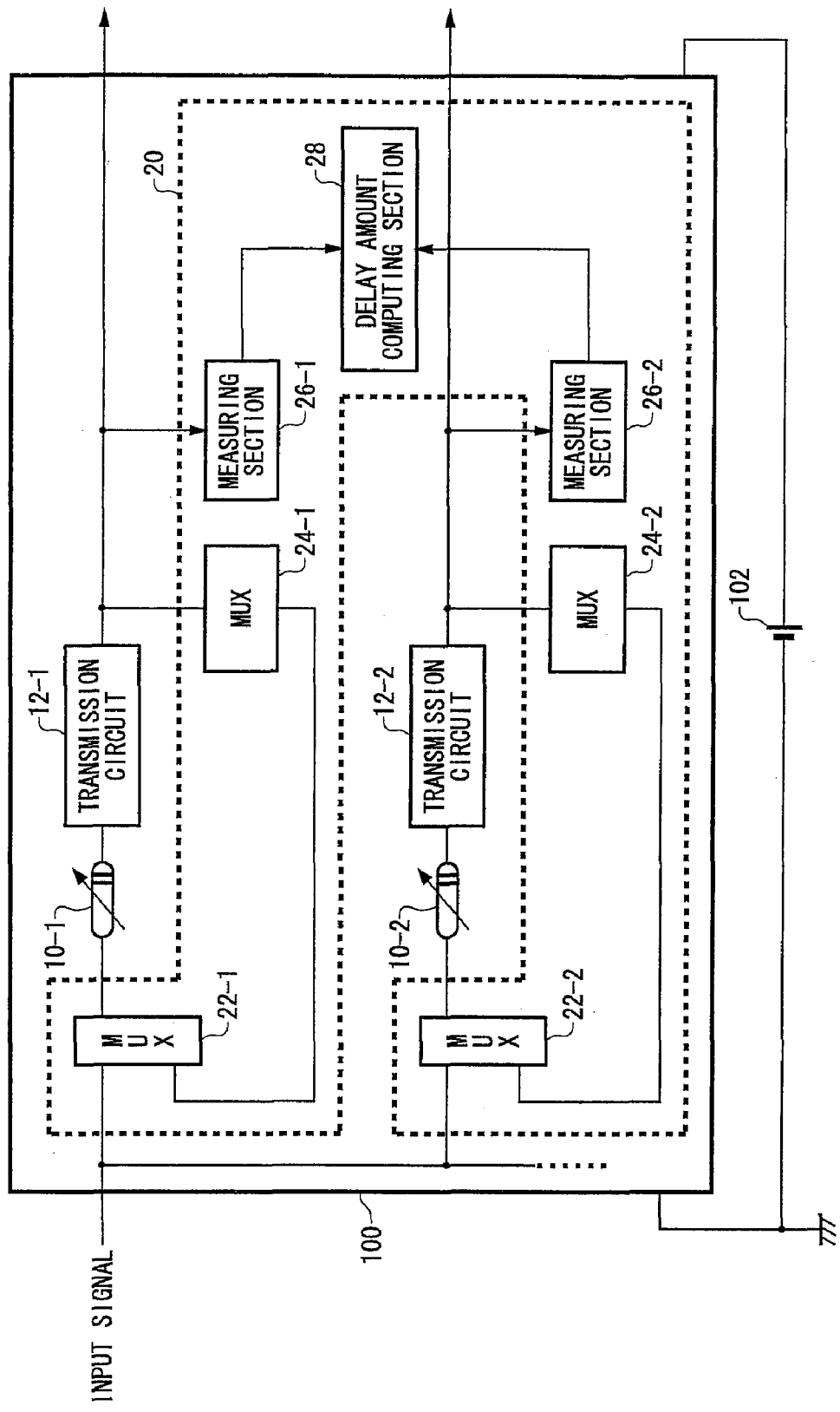
FIG. 1 is a view exemplary showing a configuration of a delay circuit 100 according to an embodiment of the present invention.

FIG. 1 is a view exemplary showing a configuration of a delay circuit 100 according to an embodiment of the present invention. The delay circuit 100 is a circuit that delays and outputs an input signal, and includes a first delay element 10-1, a second delay element 10-2, a first transmission circuit 12-1, a second transmission circuit 12-2, and an initializing section 20. Moreover, the delay circuit 100 is supplied with a power supply voltage from a power supply 102. In the present example, each component of the delay circuit 100 is supplied with a power supply voltage from the common power supply 102.

The first delay element 10-1 and the second delay element 10-2 delay an input signal in delay amounts according to delay setting values that are set in the respective delay elements. The first transmission circuit 12-1 passes the signal output from the first delay element 10-1. Moreover, the second transmission circuit 12-2 passes the signal output from the second delay element 10-2. The first transmission circuit 12-1 and the second transmission circuit 12-2 may be a logic circuit or the like that delays a signal passing through it by a predetermined delay amount. Moreover, the first transmission circuit 12-1 and the second transmission circuit 12-2 may delay a signal in larger delay amounts than those of the first delay element 10-1 and the second delay element 10-2. Moreover, the delay amount of the first transmission circuit 12-1 is substantially the same as the delay amount of the second transmission circuit 12-2.

The initializing section 20 measures the delay amounts generated from the first delay element 10-1 and the second delay element 10-2 with respect to the delay setting values, and initializes the first delay element 10-1 and the second delay element 10-2. The initializing section 20 has a first loop path, a second loop path, a first measuring section 26-1, a second measuring section 26-2, and a delay amount computing section 28. The first loop path inputs the signal output from the first transmission circuit 12-1 into an input port of the first delay element 10-1. The first loop path in the present example has a multiplexer 22-1 and a multiplexer 24. The multiplexer 24 splits and receives the signal output from the transmission circuit 12-1, and inputs the received signal into the multiplexer 22-1. The multiplexer 22-1 selects either the input signal or a loop signal received from the multiplexer 22-1, and inputs the selected signal to the first delay element 10-1.

The second loop path inputs the signal output from the second transmission circuit 12-2 into an input port of the second delay element 10-2. The second loop path has a multiplexer 22-2 and a multiplexer 24. The multiplexer 24 has a function similar to that of the multiplexer 24, and the multiplexer 22-2 has a function similar to that of the multiplexer 22-1.

When initializing the delay circuit 100, the multiplexer 22-1 and the multiplexer 22-2 respectively input loop signals into the corresponding delay elements 10. Moreover, when the delay circuit 100 is actually operated, the multiplexer 22-1 and the multiplexer 22-2 respectively input the input signals into the corresponding delay elements 10.

Next, it will be described about when the first delay element is initialized. The first measuring section 26-1 sequentially sets different delay setting values in the first delay element 10-1. Moreover, the first measuring section 26-1 measures a period of a signal transmitted through the first loop path for each of the delay setting values. The present example is described by means of a first delay setting value for which a delay amount of the first delay element 10-1 is set to substantially zero and a second delay setting value for which a delay amount of the first delay element 10-1 is set to a predetermined value. Moreover, it is assumed that a loop period measured in correspondence with the first delay setting value is M1 and a loop period measured in correspondence with the second delay setting value is M2. Assuming that when the second delay setting value is set, a delay amount generated in the first delay element 10-1 is Tdly and a delay amount of the first transmission circuit 12-1 is Toff[1], the loop periods M1 and M2 when the power supply voltage has not been varied are given by the following expressions.

$$M1 = Toff[1]$$

$$M2 = Toff[1] + Tdly$$

Moreover, the second measuring section 26-2 sets a predetermined delay setting value in the second delay element 10-2, and measures a period of the signal transmitted through the second loop path. In addition, the second measuring section 26-2 measures the period of the signal transmitted through the second loop path in synchronization with the first measuring section 26-1 and without changing the delay setting value in the second delay element. In the present example, the second measuring section 26-2 sets the delay amount of the second delay element 10-2 to substantially zero, and measures a loop period thereof. Moreover, it is assumed that a loop period measured by the second measuring section 26-2 simultaneously with the loop period M1 is M3 and a loop period measured by the second measuring section 26-2 simultaneously with the loop period M2 is M4. Assuming that a delay amount of the second transmission circuit 12-2 is Toff[2], the loop periods M3 and M4 when the power supply voltage has not been varied are given by the following expression.

$$M3=M4=Toff[2]$$

The delay amount computing section 28 corrects each loop period (that is to say, a delay amount on a loop path) measured by the first measuring section 26-1 by means of the loop period synchronously measured by the second measuring section 26-2, and computes a delay amount for each delay setting value of the first delay element 10-1. Since the second measuring section 26-2 measures a loop period in synchronization with the first measuring section 26-1 without changing the delay setting value of the second delay element 10-2, a variation of the power supply voltage produced when measuring the loop periods M1 and M2 can be detected on the basis of the measurement result measured by the second measuring section 26-2. The delay amount computing section 28 may correct a measurement error in a measurement result measured by the first measuring section 26-1, which is caused by a variation of the power supply voltage of the first delay element 10-1, by means of the measurement result measured by the second measuring section 26-2.

For example, the delay amount computing section 28 may compute a delay amount D generated from the first delay element 10-1 with respect to the second delay setting value on the basis of the following expression.

$$D=(M2-M1)-(M4-M3)$$

In addition, in the present example, the delay circuit has the first measuring section 26-1 and the second measuring section 26-2 in correspondence with the first delay element 10-1 and the second delay element 10-2. However, when the delay circuit has three or more delay elements 10, the multiplexer 24 selects an output from the delay element 10 that should measure a delay amount and an output from the delay element 10 to be used for a correction from three or more delay elements 10, and inputs the selected outputs into the first measuring section 26-1 and the second measuring section 26-2. In this case, the multiplexer 24 may be mutually provided for the plurality of delay elements 10. Moreover, although a common input signal is provided to the first delay element 10-1 and the second delay element 10-2 in the present example, input signals may be independently provided to the delay elements in another example.

Figure 2:
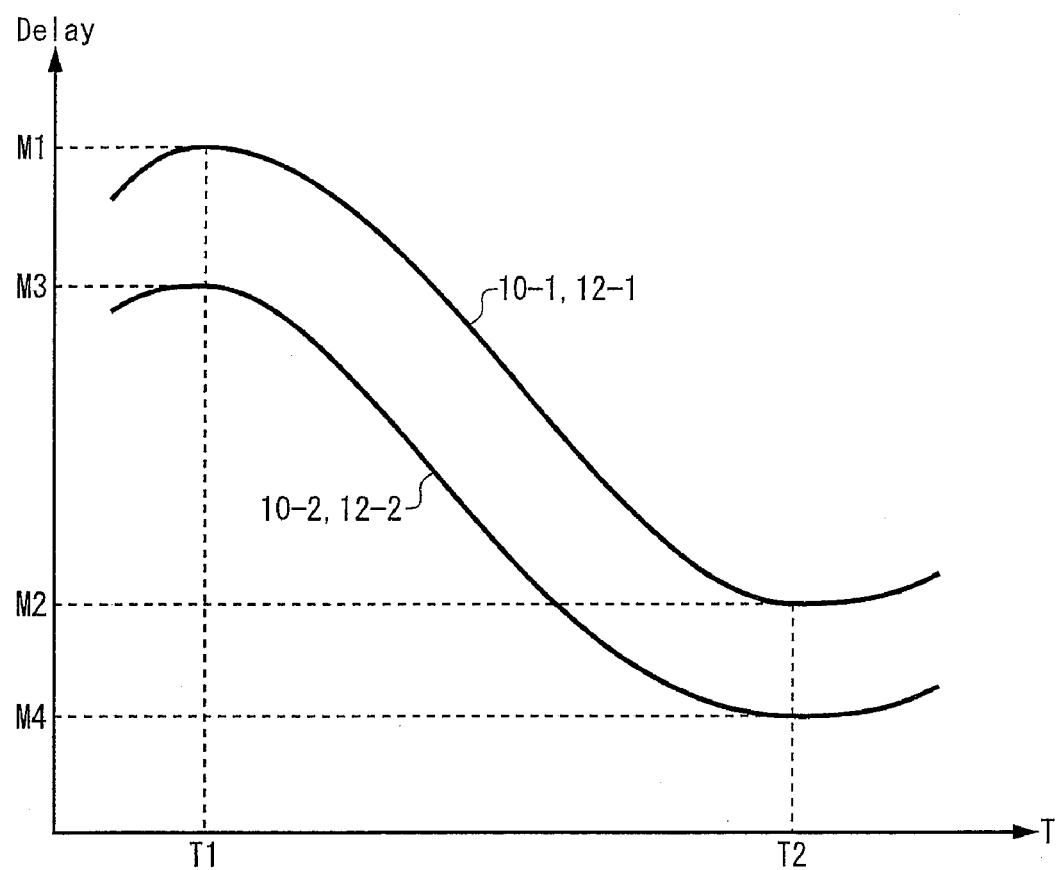
FIG. 2 is a view exemplary showing a variation of a delay amount when a power supply voltage varies.

FIG. 2 is a view exemplary showing a variation of a delay amount when the power supply voltage varies. As shown in FIG. 2, a delay amount of the first delay element 10-1 and the first transmission circuit 12-1 and a delay amount of the second delay element 10-2 and the second transmission circuit 12-2 may be changed every measurement time instant T due to a variation of the power supply voltage.

It will be described about a case in which the power supply voltage is varied and each delay amount is decreased by 0.1% between a time instant T1 at which the loop periods M1 and M3 are measured and a time instant T2 at which the loop periods M2 and M4 are measured. In this case, the delay amount D is given by the following expression.

$$\begin{aligned} D &= (M2-M1)-(M4-M3) \quad \text{Expression (1)} \\ &= (Toff[1]*99.9\% + Tdly*99.9\% - Toff[1]) - \\ &\quad (Toff[2]*99.9\% - Toff[2]) \\ &= (Toff[2] - Toff[1])*0.1\% + Tdly*99.9\% \end{aligned}$$

Here, the delay amount Toff[1] in the first transmission circuit 12-1 is substantially equal to the delay amount Toff[2] in the second transmission circuit 12-2. For this reason, a variation of a delay amount of the transmission circuit 12 due to the variation of the power supply voltage can rarely have an influence on a measurement result. For example, assuming that Toff[1]=10 ns, Toff[2]=9.9 ns, and Tdly=100 ps, a measurement error provided to a measurement result due to a variation of a delay amount of the transmission circuit 12 becomes (9.9 ns−10 ns)*0.1%=0.1 ps. For this reason, the delay amount variation rarely has an influence on a measurement result for the delay amount Tdly.

On the contrary, in a conventional measuring method, when a delay amount of a transmission circuit has a variation of 0.1% due to a variation of a power supply voltage, a measurement error provided to a measurement result becomes 10 ns*0.1%=10 ps. In this case, the delay amount variation has an influence on the measurement result for the delay amount Tdly by about 10%.

In this manner, the initializing section 20 in the present example can reduce a measurement error for a delay amount. In addition, a measurement of a delay amount in the present example is particularly valid when a delay amount of the transmission circuit 12 is larger than a delay amount of the delay element 10. However, an error can be reduced compared to the conventional delay amount measurement even when the delay amount of the transmission circuit 12 is small. For example, although the transmission circuit 12 is not provided or a delay amount of the transmission circuit 12 is substantially zero, the delay circuit can detect a variation amount of a power supply voltage on the basis of a variation amount of a delay amount of the second delay element 10-2 and correct a measurement result for a delay amount of the first delay element 10-1 on the basis of this detection result, in order to measure the delay amount of the first delay element 10-1 with high precision.

Moreover, as shown in Expression (1), the delay amount computing section 28 generates a first computation result (M2−M1) obtained by subtracting the second delay amount M1 measured by the first measuring section 26-1 for the first delay setting value from the first delay amount M2 measured by the first measuring section 26-1 for the first delay setting value, generates a second computation result (M4−M3) obtained by subtracting the delay amount M3 measured by the second measuring section 26-2 in synchronization with the measurement of the second delay amount M1 from the delay amount M4 measured by the second measuring section 26-2 in synchronization with the measurement of the first delay amount M2, and subtracts the second computation result from the first computation result, in order to compute the variation amount Tdly of the delay amount of the first delay element 10-1 when a delay setting value is changed to the first delay setting value from the second delay setting value. However, a sequence in which the delay amount computing section 28 operates each delay amount is not limited to the above sequence. The delay amount computing section 28 can operate each delay amount in a sequence shown in an expression equal to Expression (1).

Moreover, it is preferable that a ratio of a variation amount of a delay amount to a variation amount of a power supply voltage in the first delay element 10-1 is substantially equal to that in the second delay element 10-2. For example, the first delay element 10-1 may have the same circuit configuration as that of the second delay element 10-2. Moreover, they may be formed of the same material. Moreover, it is preferable that a ratio of a variation amount of a delay amount to a variation amount of a power supply voltage in the first transmission circuit 12-1 is substantially equal to that in the second transmission circuit 12-2. For example, the first transmission circuit 12-1 may have the same circuit configuration as that of the second transmission circuit 12-2. Moreover, they may be formed of the same material.

Moreover, a difference between the delay amount Toff[1] in the first delay element 10-1 and the first transmission circuit 12-1 when causing the first delay element 10-1 to produce a minimum delay amount and the delay amount Toff[2] in the second delay element 10-2 and the second transmission circuit 12-2 when causing the second delay element 10-2 to produce a minimum delay amount may be equal to the delay amount Tdly corresponding to the second delay setting value. In other words, the delay amounts of the first transmission circuit 12-1 and the second transmission circuit 12-2 may be set so that the Toff[2]−Toff[1] becomes equal to the Tdly. In this case, it is preferable that the delay amounts of the first transmission circuit 12-1 and the second transmission circuit 12-2 are variable. According to this, as shown in Expression (1), a measurement error produced in the transmission circuit 12 and a measurement error produced in the first delay element 10-1 can be offset and thus a delay amount can be measured with higher precision.

Moreover, when a period difference between the loop period on the first loop path and the loop period on the second loop path is smaller than a predetermined value, signals transmitted through these loop paths may interfere with each other and thus the loop periods may be varied. For example, these loop periods may become substantially the same as each other. For this reason, the second measuring section 26-2 may set the delay amount of the second delay element 10-2 so that the signals transmitted through these loop paths have a period difference determined on condition that the signals do not interfere with each other. Moreover, the second measuring section 26-2 may set the delay amount of the second transmission circuit 12-2. The delay circuit 100 may sequentially change delay amounts of the second delay element 10-2 and cause the first measuring section 26-1 and the second measuring section 26-2 to simultaneously measure the loop periods, in order to previously measure a period difference by which mutual interference is caused.

Moreover, in the above-described example, it has been described about a case in which the delay amount corresponding to the first delay setting value is substantially zero. In another example, the delay amount corresponding to the first delay setting value may not be substantially zero. In this case, it is possible to measure the delay amount corresponding to the second delay setting value as a variation amount from the delay amount corresponding to the first delay setting value. Moreover, the second measuring section 26-2 may set a delay setting value substantially equal to the first delay setting value in the second delay element 10-2.

Moreover, although the delay amount of the first delay element 10-1 to the delay setting value has been measured in the above-described example, the delay amount computing section 28 may also measure a delay amount of the second delay element 10-2 to the delay setting value. In this case, the second measuring section 26-2 sequentially sets different delay setting values in the second delay element 10-2, and further measures each delay amount in the second delay element 10-2 on the basis of signals transmitted through the second loop path. Moreover, the first measuring section 26-1 further measures the delay amount of the first delay element 10-1 in synchronization with the second measuring section 26-2 without changing the delay setting value. Then, the delay amount computing section 28 computes the delay amount of the second delay element 10-2 in the method described with reference to Expression (1). Moreover, when the delay amount of the second delay element 10-2 is not measured, the second delay element 10-2 may be a delay element that generates a fixed delay.

Moreover, although a measurement error due to the variation of the power supply voltage in the first delay element 10-1 has been reduced in the above-described example, the delay amount computing section 28 may reduce a measurement error due to a fluctuation of temperature of the first delay element 10-1 in another example. Even in this case, a measuring method for reducing the measurement error is equal to a measuring method for reducing a measurement error due to the variation of the power supply voltage as described above. Here, the temperature of the first delay element 10-1 may be ambient temperature of the first delay element 10-1, substrate temperature, or element temperature of the first delay element 10-1.

In addition, when a measurement error due to a temperature fluctuation of the first delay element 10-1 is reduced, it is preferable that the second delay element 10-2 is provided in the vicinity of the first delay element 10-1. Moreover, when an error due to a variation of the power supply voltage is not reduced, the second delay element 10-2 and the first delay element 10-1 may receive power supply voltages from power supplies different from each other. Here, the vicinity of the first delay element 10-1 may be a position where a temperature difference between the first delay element 10-1 and the second delay element 10-2 becomes smaller than a predetermined value. Moreover, when there are three or more delay elements 10, it may be assumed that the delay element 10 at the closest position to the first delay element 10-1 is the second delay element 10-2. Moreover, the second delay element 10-2 may be provided at a position at which a distance from a heat source to the second delay element 10-2 becomes substantially equal to a distance from the heat source to the first delay element 10-1.

Figure 3:
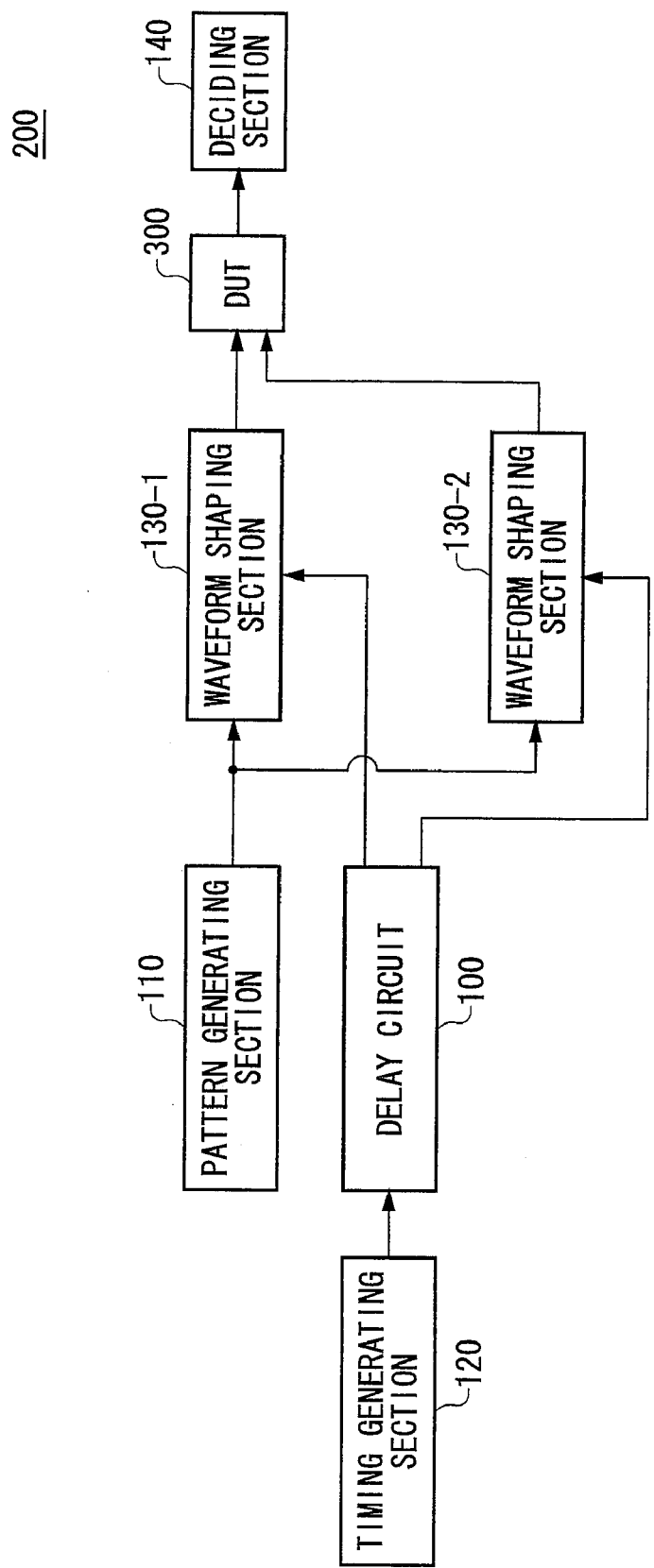
FIG. 3 is a view exemplary showing a configuration of a test apparatus 200 according to an embodiment of the present invention.

FIG. 3 is a view exemplary showing a configuration of a test apparatus 200 according to an embodiment of the present invention. The test apparatus 200 is an apparatus for testing a device under test 300 such as a semiconductor circuit, and includes a pattern generating section 110, a timing generating section 120, a delay circuit 100, a plurality of waveform shaping sections 130, and a deciding section 140.

The pattern generating section 110 generates a test pattern for testing the device under test 300. For example, the pattern generating section 110 may generate a test pattern showing a logical pattern of a test signal to be input into the device under test 300.

The plurality of waveform shaping sections 130 is provided one-to-one corresponding to a plurality of pins under test of the device under test 300. Each of the waveform shaping sections 130 generates a test signal showing a level shown in the test pattern in accordance with a given timing signal, and inputs the generated signal into a corresponding pin under test.

The timing generating section 120 generates a timing signal having a predetermined period. The timing generating section 120 may be a PLL circuit, for example. Moreover, the delay circuit 100 respectively delays timing signals and supplies the delayed signals to each of the waveform shaping sections 130. The delay circuit 100 may have the same configuration as that of the delay circuit 100 shown in FIG. 1.

For example, the delay circuit 100 may have the plurality of delay elements 10 shown in FIG. 1, which are one-to-one corresponding to the plurality of waveform shaping sections 130. Each of the delay elements 10 independently delays a timing signal to have a predetermined phase, and supplies the delayed signal to the corresponding waveform shaping section 130.

The deciding section 140 decides a quality of the device under test 300 on the basis of an output signal output from the device under test 300. For example, the deciding section 140 compares this output signal with a given expectation value signal to decide a quality of the device under test 300.

According to the test apparatus 200 in the present example, since a delay amount in the delay circuit 100 can be initialized with high precision, it is possible to test the device under test 300 with high precision. Moreover, when the delay circuit 100 has three or more delay elements 10 and initializes each of the delay elements 10 as the first delay element 10-1 described in FIG. 1, it may be assumed that the delay element 10 located at the closest position to this delay element 10 is the second delay element 10-2 described in FIG. 1 in the delay circuit 100. Moreover, when the delay circuit 100 is formed over a plurality of chips, it may be assumed that the delay elements 10 formed on a same chip are the first delay element 10-1 and the second delay element 10-2 described in FIG. 1 in the delay circuit 100.

Moreover, when the deciding section 140 samples an output signal from the device under test 300 in accordance with a given strobe signal, the timing generating section 120 may generate this strobe signal. In this case, the delay circuit 100 may delay this strobe signal and supply the delayed signal to the deciding section 140. When the deciding section 140 has a plurality of timing comparators in correspondence with a plurality of output pins of the device under test 300, the delay circuit 100 may independently delay each strobe signal and supply each delayed signal to each of the timing comparators.

Figure 4:
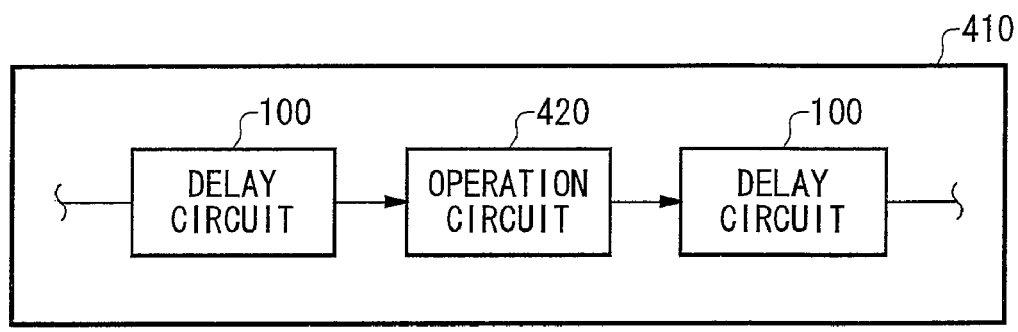
FIG. 4 is a view exemplary showing a configuration of a semiconductor chip 400 according to an embodiment of the present invention.

FIG. 4 is a view exemplary showing a configuration of a semiconductor chip 400 according to an embodiment of the present invention. The semiconductor chip 400 includes a substrate 410, an operation circuit 420, and a delay circuit 100. The operation circuit 420 and the delay circuit 100 are formed on the substrate 410. The substrate 410 is a semiconductor substrate, for example.

The operation circuit 420 is a circuit for outputting an output signal according to an input signal, for example. The delay circuit 100 is provided in at least one side of the input side and the output side of the operation circuit 420. The delay circuit 100 delays a signal input into the operation circuit 420 or a signal output from the operation circuit 420. The delay circuit 100 is equal to the delay circuit 100 described with reference to FIG. 1.

The plurality of delay elements 10 may be provided in correspondence with a plurality of input/output pins of the operation circuit 420 and may be provided in correspondence with the plurality of operation circuits 420. The semiconductor chip 400 in the present example can delay input/output signals of the operation circuit 420 with high precision. Moreover, the delay circuit 100 may delay a signal transmitted through the inside of the operation circuit 420.

Figure 5:
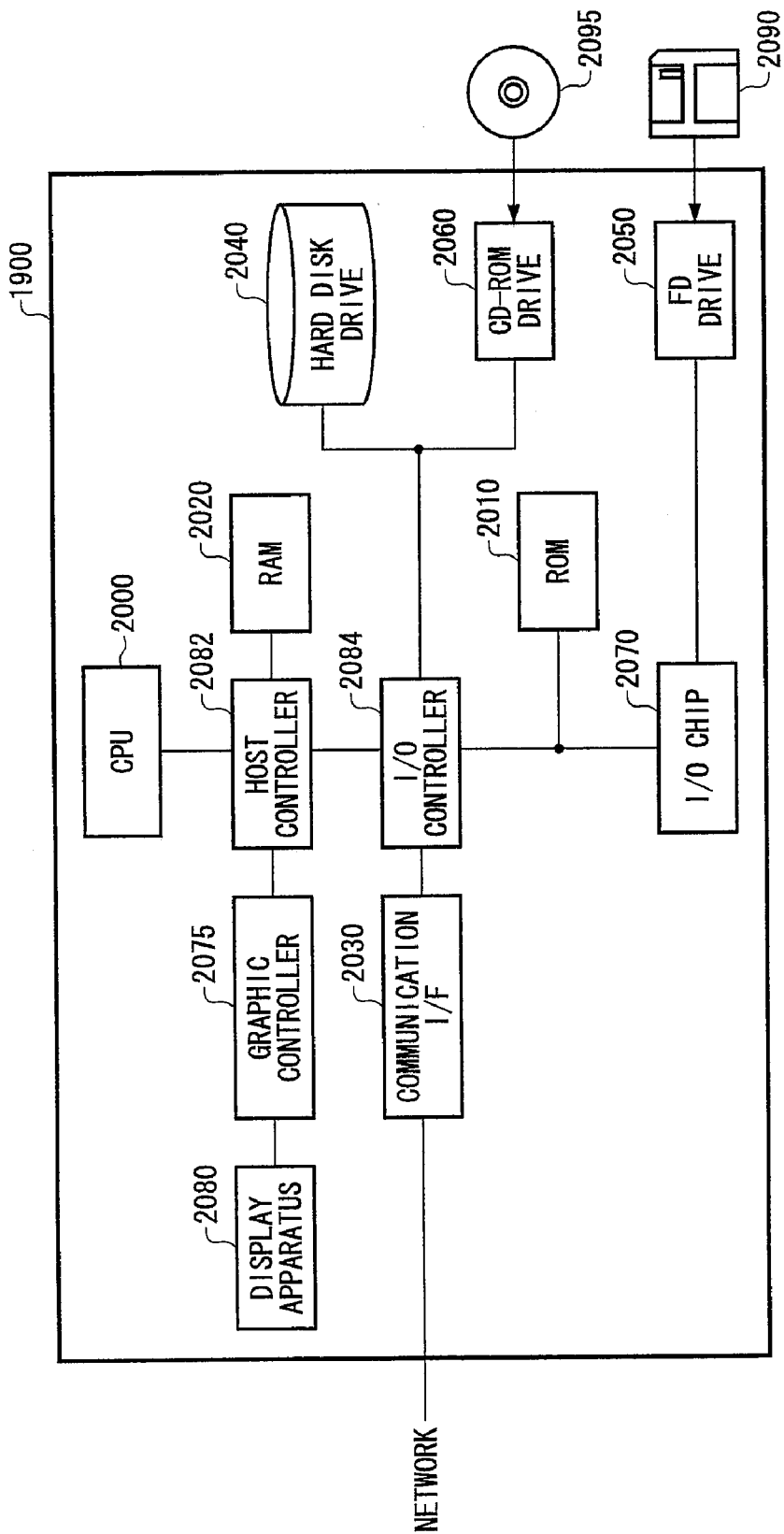
FIG. 5 is a view exemplary showing a configuration of a computer 1900 that operates on the basis of a program according to an embodiment of the present invention.

FIG. 5 is a view exemplary showing a configuration of a computer 1900 that operates based on a program according to an embodiment of the present invention. The computer 1900 functions as the initializing section 20 described in FIG. 1 on the basis of the given program. For example, this program causes the computer 1900 to function as the first measuring section 26-1, the second measuring section 26-2, and the delay amount computing section 28, which are described with reference to FIG. 1.

The computer 1900 according to the present embodiment includes a CPU peripheral section, an input-output section, and a legacy input-output section. The CPU peripheral section has a CPU 2000, a RAM 2020, a graphic controller 2075, and a display apparatus 2080 that are connected to one another by a host controller 2082. The input-output section has a communication interface 2030, a hard disk drive 2040, and a CD-ROM drive 2060 that are connected to the host controller 2082 by an input-output controller 2084. The legacy input-output section has a ROM 2010, a flexible disk drive 2050, and an input-output chip 2070 that are connected to the input-output controller 2084.

The host controller 2082 connects the RAM 2020 to the CPU 2000 and the graphic controller 2075 for accessing the RAM 2020 at high transfer rate. The CPU 2000 operates based on a program stored on the ROM 2010 and the RAM 2020 to control each section. The graphic controller 2075 acquires image data generated by the CPU 2000 on a frame buffer provided in the RAM 2020, and displays the data on the display apparatus 2080. Alternatively, the graphic controller 2075 may include therein the frame buffer storing the image data generated from the CPU 2000.

The input-output controller 2084 connects the host controller 2082 to the communication interface 2030, the hard disk drive 2040, and the CD-ROM drive 2060 that are a comparatively fast input-output apparatus. The communication interface 2030 communicates with the other apparatuses through a network. The hard disk drive 2040 stores a program and data to be used by the CPU 2000 in the computer 1900. The CD-ROM drive 2060 reads a program or data from a CD-ROM 2095, and provides the program or data to the hard disk drive 2040 via the RAM 2020.

Moreover, the ROM 2010, the flexible disk drive 2050, and the input-output chip 2070 that are a comparatively low-speed input-output apparatus are connected to the input-output controller 2084. The ROM 2010 stores a boot program to be executed during starting the computer 1900, a program dependent on hardware of the computer 1900, or the like. The flexible disk drive 2050 reads a program or data from a flexible disk 2090, and provides the program or data to the hard disk drive 2040 via the RAM 2020. The input-output chip 2070 connects the flexible disk drive 2050 to various kinds of input-output apparatuses via a parallel port, a serial port, a keyboard port, a mouse port, or the like.

A program provided to the hard disk drive 2040 via the RAM 2020 is stored on a recording medium such as the flexible disk 2090, the CD-ROM 2095, or an IC card in order to be provided by a user. The program is read from the recording medium, is installed in the hard disk drive 2040 in the computer 1900 via the RAM 2020, and is executed by the CPU 2000.

This program is installed in the computer 1900. This program works on the CPU 2000 or the like, and causes the computer 1900 to function as the initializing section 20 described above.

The program described above may be stored on an outside computer-readable medium. The computer-readable medium can include an optical recording medium such as a DVD or a CD, a magneto-optical recording medium such as an MO, a tape medium, a semiconductor memory such as an IC card, and so on, in addition to the flexible disk 2090 and the CD-ROM 2095. Moreover, a storage device such as a hard disk or a RAM provided in a server system connected to a private communication network or Internet may be used as a recording medium, and a program may be provided to the computer 1900 via a network.

Although the present invention has been described by way of exemplary embodiments, it should be understood that those skilled in the art might make many changes and substitutions without departing from the spirit and the scope of the present invention. It is obvious from the definition of the appended claims that embodiments with such modifications also belong to the scope of the present invention.

As apparent from the above descriptions, according to an embodiment of the present invention, it is possible to measure a delay amount of a delay element with high precision.

What is claimed is:

1. A delay circuit that delays an input signal to output a delayed signal, comprising:
    a first delay element that delays the input signal by a first delay amount according to a delay setting value that is set;
    a second delay element that delays the input signal by a second delay amount according to a delay setting value that is set; and
    an initializing section that measures the first delay amount with respect to each of the delay setting values and initializes the first delay element,
    the initializing section comprising:
    a first loop path that inputs an output signal of the first delay element into the first delay element;
    a first measuring section that sequentially sets delay setting values mutually different from the delay setting value in the first delay element and sequentially measures the first delay amount on the basis of signals transmitted through the first loop path;
    a second measuring section that measures the second delay amount in synchronization with the first measuring section; and
    a delay amount computing section that corrects each of the first delay amounts measured by the first measuring section by means of the second delay amount measured by the second measuring section in synchronization with this first delay amount and computes the first delay amount for each of the delay setting values of the first delay element, wherein
    the initializing section further has a second loop path that inputs an output signal of the second delay element into the second delay element, and
    the second measuring section measures the second delay amount in synchronization with the first measuring section on the basis of a signal transmitted through the second loop path without changing the delay setting value of the second delay element.

2. The delay circuit as claimed in claim 1, wherein
    the second delay element receives a power supply voltage from a power supply common to the first delay element, and
    the delay amount computing section corrects a measurement error in a measurement result measured by the first measuring section, which is caused by a variation of a power supply voltage of the first delay element, by means of a measurement result measured by the second measuring section.

3. The delay circuit as claimed in claim 2, wherein
    the first measuring section sets the delay setting value causing the first delay element to generate a minimum delay amount in the first delay element as the first delay setting value, and
    the second measuring section sets the delay setting value causing the second delay element to generate a minimum delay amount in the second delay element.

4. The delay circuit as claimed in claim 3, wherein a ratio of a variation amount of the delay amount of the second delay element to a variation amount of the power supply voltage is substantially equal to a ratio of a variation amount of the delay amount of the first delay element to the variation amount of the power supply voltage.

5. The delay circuit as claimed in claim 2, wherein a first transmission circuit provided on the first loop path and a second transmission circuit provided on the second loop path receive a power supply voltage from the power supply common to the first delay element.

6. The delay circuit as claimed in claim 5, wherein a ratio of a variation amount of a second transmission delay amount of the second transmission circuit to a variation amount of the power supply voltage is substantially equal to a ratio of a variation amount of a first transmission delay amount of the first transmission circuit to the variation amount of the power supply voltage.

7. The delay circuit as claimed in claim 6, wherein a difference between i) a first combined delay amount of the first delay element and the first loop path when causing the first delay element to produce the minimum delay amount and ii) a second combined delay amount of the second delay element and the second loop path when causing the second delay element to produce the minimum delay amount is substantially equal to the first delay amount corresponding to the second delay setting value.

8. The delay circuit as claimed in claim 7, wherein the second measuring section sets the delay amount of the second delay element such that a loop period on the second loop path and a loop period on the first loop path have a period difference determined on condition that the signal transmitted through the first loop path and the signal transmitted through the second loop path do not interfere with each other.

9. The delay circuit as claimed in claim 1, wherein
    the second measuring section sequentially sets different delay setting values in the second delay element and further respectively measures the second delay amount on the basis of signals transmitted through the second loop path,
    the first measuring section further measures the first delay amount in synchronization with the second measuring section on the basis of the signals transmitted through the first loop path without changing the delay setting value, and
    the delay amount computing section corrects each second delay amount measured by the second measuring section by means of the first delay amount measured in synchronization with this delay amount by the first measuring section and further computes second delay amounts for the respective delay setting values of the second delay element.

10. The delay circuit as claimed in claim 1, wherein
    the second delay element is provided in the vicinity of the first delay element, and
    the delay amount computing section corrects a measurement error in a measurement result measured by the first measuring section, which is caused by a variation of temperature of the first delay element, by means of a measurement result measured by the second measuring section.

11. A non-transitory computer-readable medium that stores thereon a program causing an initializing section, which initializes a delay circuit comprising a first delay element that delays an input signal by a first delay amount according to a delay setting value that is set, a second delay element that delays the input signal by a second delay amount according to a delay setting value that is set, and a first loop path that inputs an output signal of the first delay element into the first delay element, to function as:
    a first measuring section that sequentially sets delay setting values mutually different from the delay setting value in the first delay element and sequentially measures the first delay amount on the basis of signals transmitted through the first loop path;

a second measuring section that measures the second delay amount in synchronization with the first measuring section; and a delay amount computing section that corrects each of the first delay amounts measured by the first measuring section by means of the second delay amount measured by the second measuring section in synchronization with this first delay amount and computes the first delay amount for each of the delay setting values of the first delay element, wherein the delay circuit further includes a second loop path that inputs an output signal from the second delay element into the second delay element, and the program causes the second measuring section to measure the second delay amount in synchronization with the first measuring section on the basis of a signal transmitted through the second loop path without changing the delay setting value of the second delay element.

12. A semiconductor chip comprising:

an operation circuit; and a delay circuit that delays a signal input into the operation circuit or a signal output from the operation circuit, the delay circuit comprising:

a first delay element that delays an input signal by a first delay amount according to a delay setting value that is set;

a second delay element that delays the input signal by a second delay amount according to a delay setting value that is set; and an initializing section that measures the first delay amount with respect to each of the delay setting values and initializes the first delay element, and the initializing section comprising:

a first loop path that inputs an output signal of the first delay element into the first delay element;

a first measuring section that sequentially sets delay setting values mutually different from the delay setting value in the first delay element and sequentially measures the first delay amount on the basis of signals transmitted through the first loop path;

a second measuring section that measures the second delay amount in synchronization with the first measuring section; and a delay amount computing section that corrects each of the first delay amounts measured by the first measuring section by means of the second delay amount measured by the second measuring section in synchronization with this first delay amount and computes the first delay amount for each of the delay setting values of the first delay element, wherein the initializing section further has a second loop path that inputs an output signal of the second delay element into the second delay element, and the second measuring section measures the second delay amount in synchronization with the first measuring section on the basis of a signal transmitted through the second loop path without changing the delay setting value of the second delay element.

13. The semiconductor chip as claimed in claim 12, wherein the second delay element receives a power supply voltage from a power supply common to the first delay element, and the delay amount computing section corrects a measurement error in a measurement result measured by the first measuring section, which is caused by a variation of a power supply voltage of the first delay element, by means of a measurement result measured by the second measuring section.

\* \* \* \* \*